United States Patent [19]

Namiki et al.

[11] Patent Number: 5,633,121
[45] Date of Patent: May 27, 1997

[54] METHOD FOR EXAMINING SURFACE OF COPPER LAYER IN CIRCUIT BOARD AND PROCESS FOR PRODUCING CIRCUIT BOARD

[75] Inventors: Takahisa Namiki; Yasuo Yamagishi; Ei Yano, all of Kawasaki, Japan

[73] Assignee: Fujitsu Limited, Kawasaki, Japan

[21] Appl. No.: 662,299

[22] Filed: Jun. 12, 1996

Related U.S. Application Data

[63] Continuation of Ser. No. 520,734, Aug. 29, 1995, abandoned, which is a continuation of Ser. No. 202,657, Feb. 28, 1994, abandoned.

[30] Foreign Application Priority Data

Apr. 21, 1993 [JP] Japan .................. 5-094280

[51] Int. Cl.$^6$ ............................................ G03F 7/00
[52] U.S. Cl. ............................ 430/313; 430/30; 430/315; 430/318; 356/357; 356/381
[58] Field of Search ........................... 430/30, 311, 313, 430/315, 318; 356/381, 382, 357

[56] References Cited

U.S. PATENT DOCUMENTS

| | | | |
|---|---|---|---|
| 4,217,182 | 8/1980 | Cross | 204/15 |
| 4,512,829 | 4/1985 | Ohta et al. | 156/659.1 |
| 4,899,055 | 2/1990 | Adams | 250/372 |
| 4,957,370 | 9/1990 | Tominaga | 356/381 |
| 5,068,810 | 11/1991 | Ott | 364/526 |
| 5,120,966 | 6/1992 | Kondo | 250/372 |

FOREIGN PATENT DOCUMENTS

| | | |
|---|---|---|
| 0169664 | 1/1986 | European Pat. Off. . |
| 57-50645 | 3/1982 | Japan . |
| 61-173104 | 8/1986 | Japan . |
| 1-081300 | 3/1989 | Japan . |
| 4-095859 | 3/1992 | Japan . |

OTHER PUBLICATIONS

Yamagishi et al., "A Multicolor Projection Display Using Nematic–Cholesteric Liquid Crystal," *IEEE Transactions on Electron Devices*, vol. 36, No. 9, Sep. 1989, pp. 1888–1891.

*Primary Examiner*—Kathleen Duda
*Attorney, Agent, or Firm*—Staas & Halsey

[57] ABSTRACT

The surface of a copper layer in a circuit board is irradiated with a beam, and the degree of progress of oxidation of the surface of the copper layer is determined by taking advantage of the resultant reflected beam (for example, an intensity or a hue of a reflected beam). Then, the step of coating a resist is carried out only when the thickness of the copper oxide film is not more than about 10 nm. Alternatively, the step of coating a resist may be carried out after removal or reduction of the oxide film or cladding of the oxide film with copper.

The present invention enables occurrence of peeling of the resist or dive of plating to be prevented in the step of effecting selective etching or plating of a copper layer in a circuit board using a resist pattern as a mask.

15 Claims, 5 Drawing Sheets

METHOD FOR EXAMINING SURFACE OF COPPER LAYER IN CIRCUIT BOARD AND PROCESS FOR PRODUCING CIRCUIT BOARD

This application is a continuation, of application Ser. No. 08/520,734, filed Aug. 29, 1995, now abandoned, which is a continuation, of application Ser. No. 08/202,657, filed Feb. 28, 1994, now abandoned.

BACKGROUND OF THE INVENTION

1. Field of the Invention

The present invention relates to a method for examining the surface of a copper layer in a circuit board and a process for producing the same. In particular, it is concerned with a method for previously measuring the degree of oxidation of the surface of a copper layer in a circuit board when the surface of the copper layer in the circuit board is subjected to etching or plating.

2. Description of the Related Art

A printed circuit board is a board, on which elements, such as LSI, are to be mounted. An actual electronic circuit is completed by using this board.

With respect to electronic equipment, a reduction in size, a reduction in weight, a reduction in thickness, rendering the equipment multifunctional and an improvement in performance have lead to an ever-increasing demand for an increase in density and an increase in precision of printed circuit boards. This has resulted in a further increase in fineness and degree of multilayer interconnection.

At the present time, a high-density interconnection having a conductor width (a pattern width) of 50 µm and 3 or more lines between IC pins are necessary. For this reason, it is difficult to form the circuit by printing, so that photolithography using a dry film resist or a liquid photosolder resist is utilized.

The method for forming a circuit in a printed circuit board is roughly divided into a subtractive method in which copper is removed by etching and an additive method in which only a necessary portion is plated with copper. Although they are further divided into respective several groups, the subtractive method includes the step of effecting patterning of a copper layer using a resist. Also in the case of the additive method, the step of patterning of the copper layer with a resist becomes necessary with an increase in the degree of multilayer interconnection- Thereafter, in the case of the subtractlye method, copper is removed with etching, while in the case of the additive method, copper plating is carried out.

Patterning of the copper layer followed by etching often causes the resist to be peeled off. When the plating is effected, dive of plating into under the resist in addition to peeling of the resist often occurs. These phenomena are causative of short-circuit of the interconnection and breaking of interconnection, which is a large cause of a lowering in yield in the production of printed circuit boards.

Accordingly, an object of the present invention is to provide a method for preventing the above-described problems, i.e., peeling of the resist and dive of plating into under the resist.

SUMMARY OF THE INVENTION

In order to attain the above-described object, the present invention relates to a method for examining the surface of a copper layer in a circuit board, comprising the steps of: irradiating the surface of a copper layer in a circuit board with a beam and measuring the degree of progress or proceed of oxidation of the copper layer in its surface by taking advantage of a reflected beam.

As a result of extensive and intensive studies, the present inventors have found that the peeling of the resist or dive of plating is responsible for a copper oxide film which is spontaneously formed on the surface of the copper layer. In this case, copper oxide is mainly $Cu_2O$. Although CuO too is a kind of copper oxide, it is less likely to occur unless copper is heated in air at a temperature of 1000° C. or above.

Figure 1A:
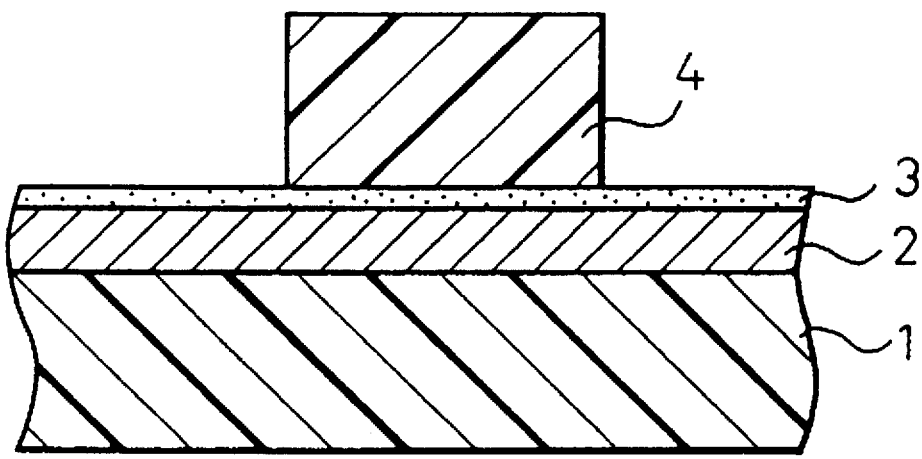
FIGS. 1A and 1B are schematic diagrams showing an influence of oxidation of a copper layer in its surface.
Figure 1B:
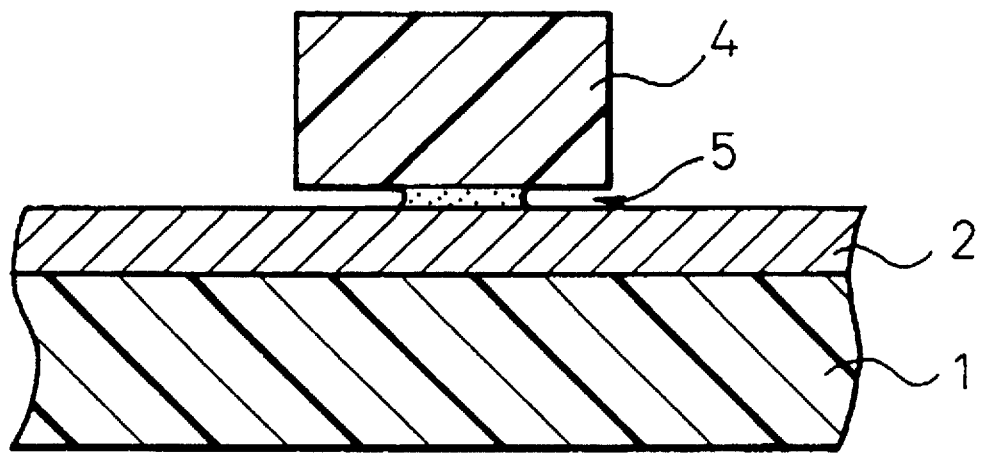

With reference to FIG. 1A to 1B, if a copper oxide film 3 has been formed due to oxidation of the surface of a copper layer 2 on a circuit board 1, when etching or plating is carried out after coating of the resist 4 and subsequent patterning (see FIG. 1A), since the solubility of copper oxide in an acid or an alkali solution is substantially higher than that of copper, an etching solution or a plating solution (both of them being acidic or alkaline) dissolves the copper oxide film present under the resist, which gives rise to dive 5 of the etching solution or plating solution into under the resist. This results in peeling of the resist or dive of plating (see FIG. 1B). The peeling of the resist and the dive of the plating depend upon the degree of progress of oxidation of the copper layer on its surface, and particularly when the thickness of the copper oxide film is about 10 nm or more, the above phenomena become significant.

These phenomena will now be described in more detail.

① In the case of the subtractive method, acidic or alkaline etching is effected. At that time, since copper oxide is dissolved in both acid and alkali solutions, the etching solution penetrates into under the resist, which gives rise to peeling of the resist.

② In the case of the additive method, an electroless plating solution used is strongly alkaline, and an electroplating solution used is strongly acidic. Therefore, the plating solution penetrates into under the resist to cause peeling of the resist and dive of the plating. In addition, in order to improve adhesion of the plating, it is common practice to effect cleaning with sulfuric acid (activation of the surface of copper) prior to plating. In this case, peeling becomes more significant. This is considered causative of the peeling of the resist or dive of the plating.

On the other hand, when the progress of oxidation is not very significant and the thickness of the copper oxide film is less than 10 nm, no trouble occurs. From this fact, it has been found that occurrence of the trouble can be prevented by measuring the thickness of the copper oxide film present on the copper layer and using only circuit boards having an oxide film thickness of less than 10 nm. The copper oxide film thickness is preferably less than 5 nm.

In this case, the degree of progress of oxidation and thickness of the copper oxide film are determined by measuring the amount of oxygen atoms with a surface analyzer ESCA (electron spectroscopy for chemical analysis) while dry etching the surface with $Ar^+$ ion.

However, ESCA is a very expensive device (several ten million to several hundred million yen), needs a lot of time for the measurement (one hour or less) and is used in a destructive test in which the surface of copper is etched although the etched area is small, so that ESCA cannot be applied in an actual process. For this reason, it is necessary to develop a method for measuring the degree of progress of oxidation (thickness of the copper oxide film) in a non-destructive manner using a more inexpensive derive.

In view of the above, the present inventors have made further studies and, as a result, have found that there is a correlation between light reflection characteristics and degree of progress of oxidation (thickness of copper oxide film).

The color of the copper film gradually changes from light yellow to red as the oxidation progresses. This gives rise to a change in not only kind of color (hue) but also reflection characteristics and saturation (vividness) of visible light and ultraviolet rays. Therefore, the degree of progress of oxidation and the thickness of the copper oxide film can be measured by monitoring these changes. Further, since this can be carried out by simply applying a beam to measure a reflected beam, the measuring time can be saved. Further, the test can be carried out without etching a sample, that is, in a non-destructive manner. The device used is very inexpensive as compared with ESCA.

In particular, a method for measuring a change in hue and a change in C* in a L*a*b* color specification system is less likely to be affected by scattering derived from an uneven surface of the copper layer and, hence, very reliable as a method for determining the degree of oxidation of the copper layer in its surface and favorable from the viewpoint of the object of the present invention.

Thus, according to one aspect of the present invention, there is provided a method for measuring the degree of oxidation of the copper layer in its surface, comprising the steps of: irradiating the surface of a copper layer with an ultraviolet beam or visible light beam having a predetermined wavelength and determining the intensity ratio of the reflected beam to the irradiated beam. According to another aspect of the present invention, there is provided a method for measuring the degree of oxidation of the copper layer in its surface, comprising the steps of: irradiating the surface of a copper layer with a visible light beam and measuring the light intensity of the beam reflected from the surface of the copper layer.

In order to attain the object of the present invention, according to a further aspect of the present invention, there is provided a process for producing a circuit board, conrising the steps of: coating a resist over a copper layer on a circuit board and subjecting the resist to patterning; and selectively etching the copper layer by using the patterned resist as am ask no form a circuit on the circuit board, wherein, before the step of coating the resist, the surface of the copper layer in the circuit board is irradiated with a beam and the degree of progress or proceed of oxidation of the copper layer in its surface is measured by taking advantage of the resultant reflected beam. According to a further aspect of the present invention, there is provided a process for producing a circuit board, comprising the steps of: coating a resist over a copper layer on a circuit board and subjecting the resist to patterning; and subjecting the surface of the copper layer to selective plating by using the patterned resist as a mask to form a circuit on the circuit board, wherein, before the step of coating the resist, the surface of the copper layer is irradiated with a beam and the degree of progress of oxidation of copper layer of the circuit board on its surface is measured by taking advantage of the resultant reflected beam.

Further, according to the present invention, in the above-described measurement of the degree of oxidation of the copper layer in its surface in the production of a circuit board, when the degree of oxidation of the copper layer in its surface exceeds a predetermined value, the circuit board is not used any more or alternatively the step of coating of a resist and patterning is effected after either copper oxide on the surface of the copper layer is removed or reduced or the copper oxide layer is clad with copper, thereby preventing peeling of the resist or dive of the plating.

The removal of copper oxide can be carried out, for example, by cleaning with strong acids, such as sulfuric acid or nitric acid, or cleaning with an organic alkali, such as triethylamine, pyridine or aniline. The reduction of copper oxide can be carried out, for example, by electrolytic reduction or reduction with reducing agents, such as various sulfites, formic acid or oxalic acid. The cladding of the surface of copper oxide with copper can be carried out, for example, by plating, vacuum deposition of copper or other methods.

EXAMPLES

Example 1

Figure 2:
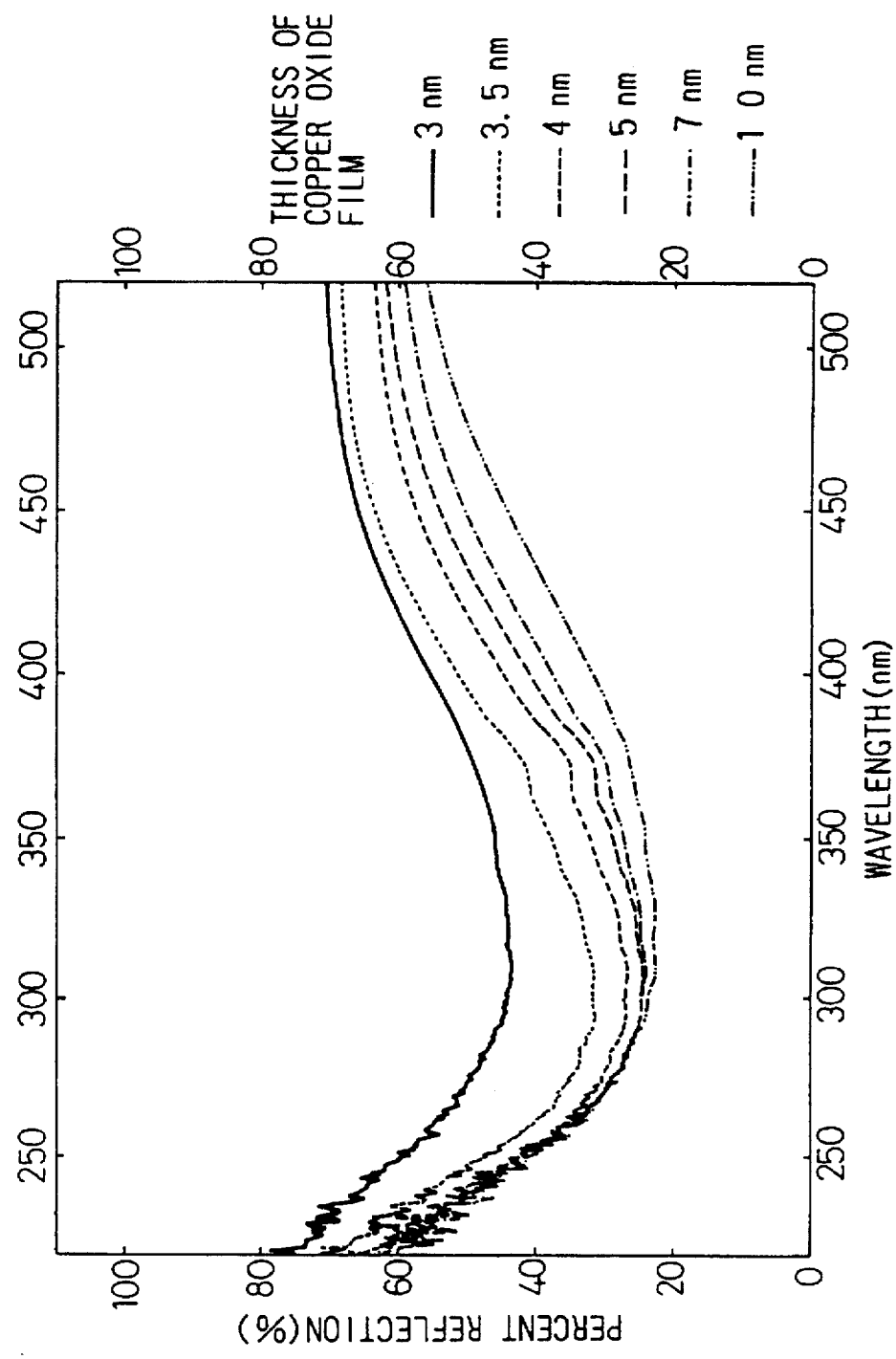
FIG. 2 is a graph showing the dependency of an UV-ray reflection spectrum upon the thickness of a copper oxide film.
Figure 3:
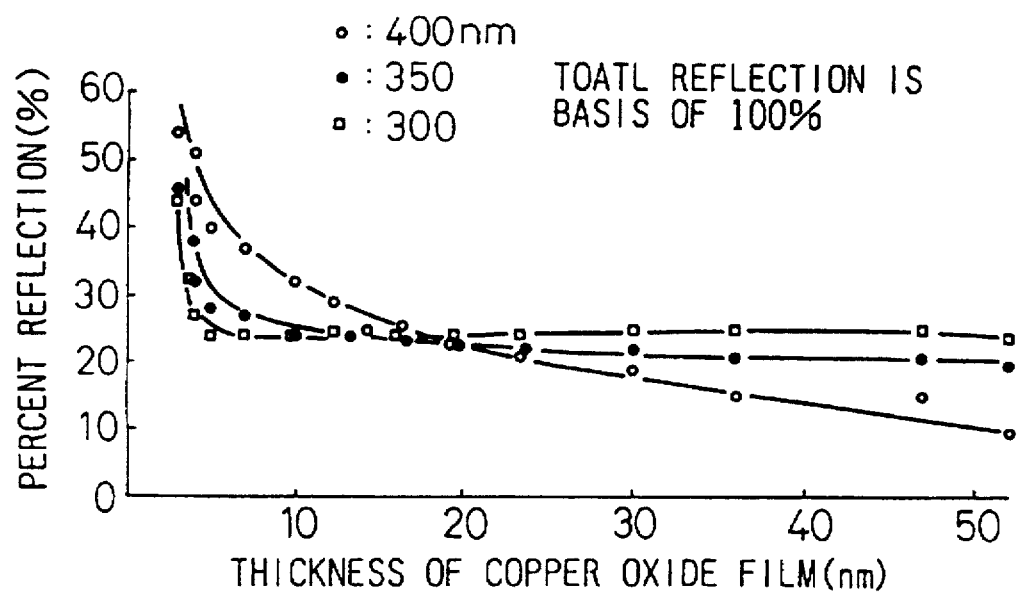
FIG. 3 is a graph showing the dependency of a percent reflection of UV rays upon the thickness of a copper oxide film.
Figure 4:
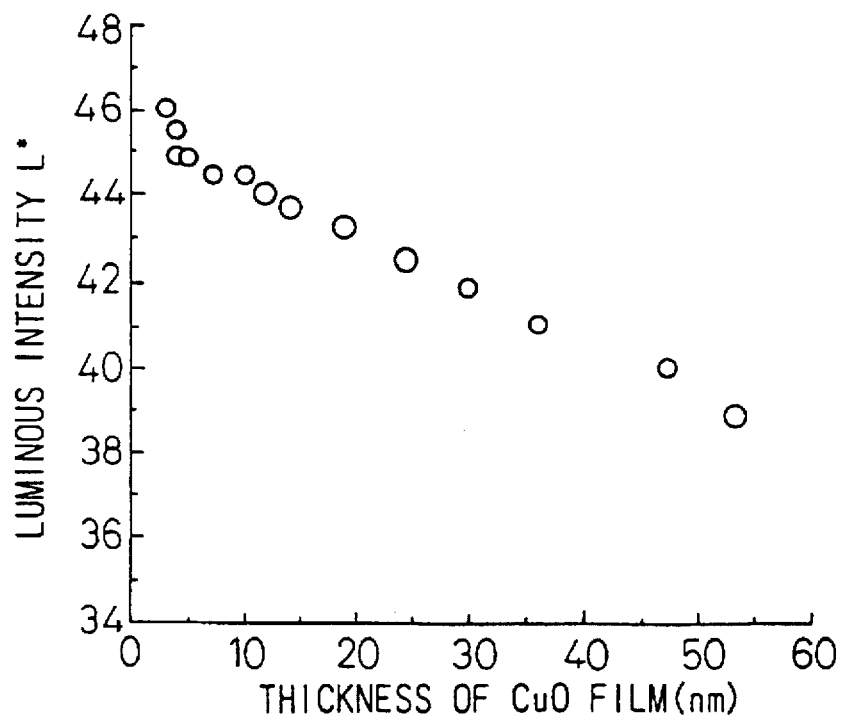
FIG. 4 is a graph showing the dependency of a luminous intensity of a reflected beam upon the thickness of a copper oxide film.
Figure 5:
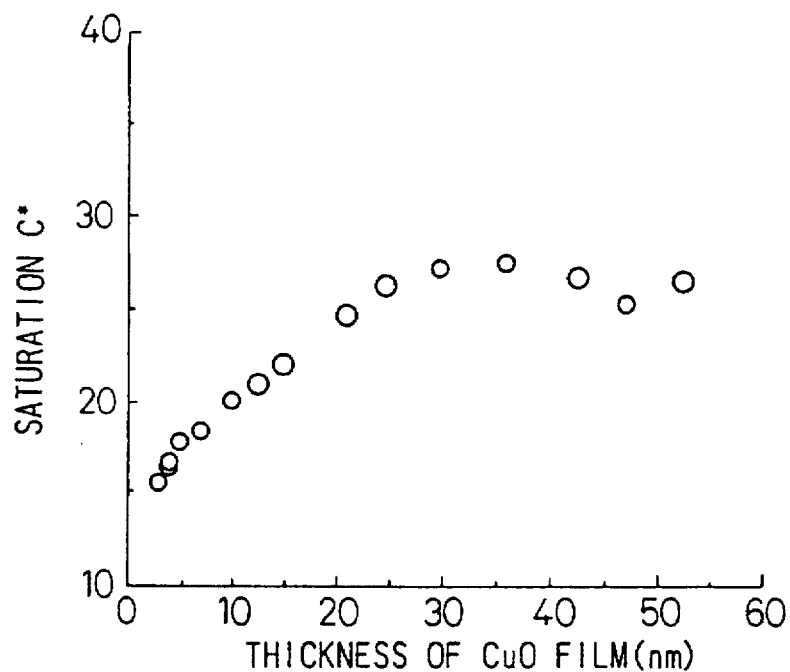
FIG. 5 is a graph showing the dependency of a saturation of a reflected beam upon the thickness of a copper oxide film.
Figure 6:
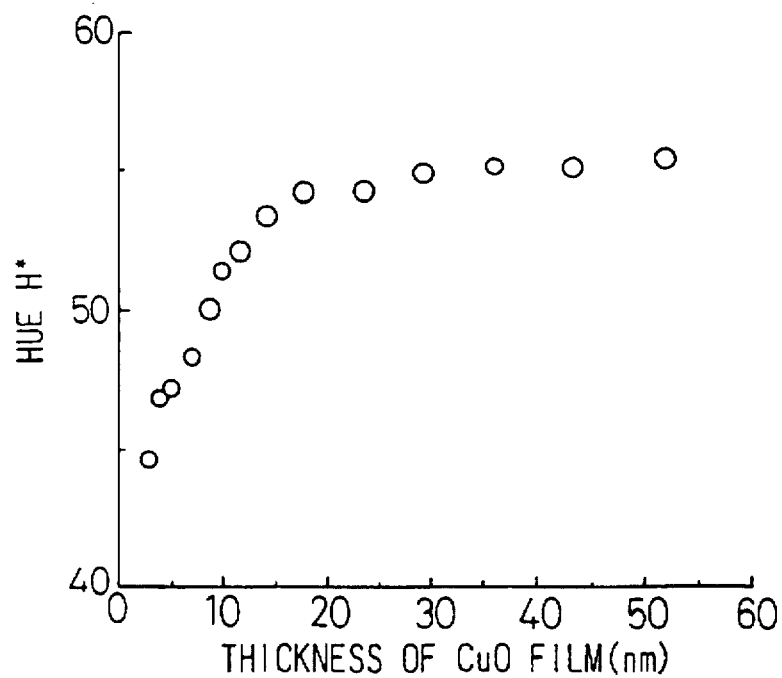
FIG. 6 is a graph showing the dependency of a hue of a reflected beam upon the thickness of a copper oxide film.
Figure 7:
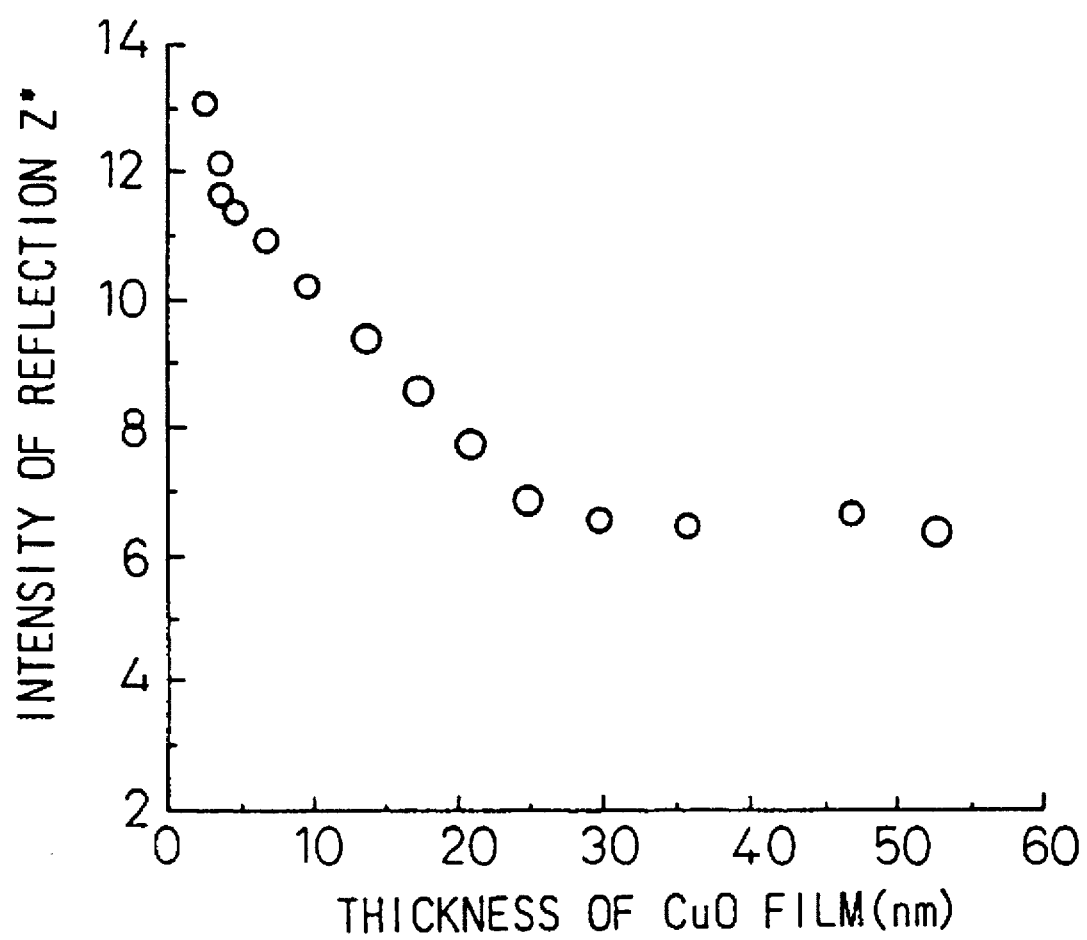
FIG. 7 is a graph showing the dependency of an intensity of reflection at short wavelengths upon the thickness of an oxide film.

An example of a reflected beam spectrum in irradiation of copper having varied copper oxide film thicknesses with ultraviolet rays is shown in FIG. 2, and the relationship between the percent reflection at wavelengths of 300 nm, 350 nm and 400 nm and the thickness of copper oxide film is shown in FIG. 3. In FIGS. 2 and 3, the percent reflection of an aluminum total reflection mirror is taken as 100%. It is apparent that the percent reflection decreases with increasing the thickness of the copper oxide film. In particular, at 400 nm, the percent reflection is sensitive to a change in thickness up to a copper oxide film thickness of 10 nm, which is suitable for the examination in the stage prior to the etching treatment or plating treatment. If the percent reflection is 35% or more at 400 nm, no problem occurs even when etching or plating is carried out in a copper oxide film thickness of less than 10 nm. According to this method, the time taken for examination is 1 to 2 min at the maximum. The device tool is relatively inexpensive (not more than five million yen), and the examination can be carried out in a non-destructive manner.

Example 2

FIGS. 4 to 7 are graphs showing the relationship between the liminous intensity (FIG. 4), saturation (FIG. 5), hue (FIG. 6) and intensity of reflection (FIG. 7) of a visible light beam and the thickness of a copper oxide film, respectively.

In the graphs, according to L*a*b* color specification, L* corresponds to luminous intensity of reflection based on the whole wavelength of the reflected beam, C* corresponds to saturation (vividness), H* corresponds to kind of color (hue), Z* corresponds to luminous intensity of short-wavelength beam. There is a tendency that an increase in thickness of the copper oxide film causes a lowering in L*, an increase in C*, an increase in H* and a lowering in Z*. From the graphs, it is apparent that if L*, C*, H* and Z* are respectively not less than 45, not more than 20, not more than 50 and not less than 10, no problem occurs even when etching or plating is carried out in a copper oxide film thickness of less than 10 nm. Any of them may be used for the measurement of the oxide film. Even when all of them are measured, the total time for the measurement is less than 1 min. Further, the device (commercially available color difference meter) is inexpensive (not more than three million yen), and the examination can be carried out without destructing the sample.

Example 3

A board comprising a ceramic board (10 cm×10 cm) and copper vapor-deposited on the ceramic board to a film thickness of 10 μm was prepared for a test. A resist BMR (an acrylic resist manufactured by Tokyo Ohka Kogyo Co., Ltd.) was coated on the board to a film thickness of 9 μm, and the coated board was baked at 80° C. for 20 min to remove the residual solvent.

Further, exposure and development were carried out through a mask by using a high-pressure mercury lamp at a dose of 600 mJ/cm$^2$ (365 nm) to provide a pattern having a line width of 50 μm which was used as a sample for the following experiment.

① Samples for the following experiment were prepared using boards having a percent reflection of not less than 35% at 400 nm and considered to have a copper oxide film thickness of less than 10 nm (i.e., two boards respectively having percent reflections of 38% and 42%, according to the above procedure.

These boards were subjected to electrolytic copper pattern plating by using an aqueous copper sulfate solution as a model test for the semi-additive method. The pattern plating was carried out so that the thickness of the resultant plating was about 4 μm (not more than 30 min).

In the above-described two samples, 50-μm lines were 98. In all of them, neither peeling of the resist nor dive of plating was observed.

② An experiment was carried out in the same manner as that of ①, except that boards having a percent reflection of not more than 35% at 400 nm and considered to have an oxide film thickness of not less than 10 nm (i.e., two boards respectively having percent reflections of 30% and 28%) were used.

As a result, among 98 lines of 50 μm, peeling of the resist was observed in 42 portions, and dive of plating was observed in 15 portions.

From ① and ②, it was found that occurrence of problems in an actual process can be prevented by measuring the uv-ray reflection.

③ An experiment was carried out in the same manner as that of ①, except that two boards having a L* value of not less than 45, a C* value of not more than 20, a H* value of not more than 50 and a Z* value of not less than 10 with respect to a reflected beam of a visible light beam and considered to have a copper oxide film thickness of less than 10 nm (L*=47 and 48, C*=17 and 19, H*=48 and 46 and Z*=13 and 12) were used. Similarly, when the L*, C*, H* and Z* are respectively not less than 45, not more than 17, not more than 47 and not less than 11, the thickness of the oxide film is considered to be less than 5 nm.

As a result, in 98 lines of 50 μm, neither peeling of the resist nor dive of plating was observed.

④ An experiment was carried out in the same manner as that of ①, except that two boards having a L* value of not more than 45, a C* value of not less than 20, a H* value of not less than 50 and a Z* value of not more than 10 with respect to a reflected beam of a visible light beam and considered to have a copper oxide film thickness of not less than 10 nm (L*=38 and 41, C*=22 and 25, H* =51 and 53 and Z*=7 and 7) were used.

As a result, among 98 lines of 50 μm, peeling of the resist was observed in 37 portions, and dive of plating was observed in 12 portions.

From ③ and ④, it was found that occurrence of problems in an actual process can be prevented by measuring the visible light reflection.

The above results clearly demonstrate that method for measuring the copper oxide film thickness by taking advantage of a reflected beam of ultraviolet rays or a visible light beam is superior in reliability, cost, measuring time, etc.

As described above, according to the present invention, the amount (film thickhess) of copper oxide on the surface of a copper layer in a circuit board can be measured by means of an inexpensive measuring device in a short time without destructing a sample. Further, this can prevent occurrence of problems in the production of circuits, which can contributes to a marked improvement in yield in the production of circuit boards.

We claim:

1. A process for preparing a circuit board comprising:
coating a resist on a copper layer;
patterning the resist;
selectively etching or plating the copper layer using the patterned resist as a mask to thereby form a copper circuit to be used as a part of a circuit board;
measuring a degree of oxidation of said copper layer to thereby determine the presence of an excessive degree of said oxidation equal to or greater than about 10 nm on said copper layer, said measuring being accomplished prior to coating the resist on the copper layer by irradiating a surface of the copper layer with an irradiation beam so that at least a portion of the irradiation beam is reflected from the surface as a reflected beam and evaluating a characteristic of said reflected beam as a measure of the degree of oxidation of said copper layer; and
after an excessive degree of oxidation has been determined, either removing at least a portion of the oxidized copper or covering the oxidized copper with a copper cladding prior to said coating of the copper layer with said resist.

2. A process as set forth in claim 1, wherein said irradiation beam is an ultraviolet or visible light beam having a predetermined wavelength and the characteristic which is evaluated is the intensity of the reflected beam.

3. A process as set forth in claim 2, wherein the evaluation comprises determining the ratio of the intensity of the reflected beam to the intensity of the irradiation beam.

4. A process as set forth in claim 1, wherein said irradiation beam is a visible light beam and the characteristic which is evaluated is the color of the reflected beam.

5. A process as set forth in claim 1, wherein said irradiation beam is an ultraviolet or visible light beam and the characteristic which is evaluated comprises either a ratio of the intensity of a reflected ultraviolet beam to the intensity of an irradiated ultraviolet beam, a hue of a reflected visible light beam, a luminous intensity of a reflected beam, a saturation level of a reflected visible light beam or an intensity of reflection of short wavelength radiation.

6. A process for preparing a circuit board comprising:

coating a resist on a copper layer;

patterning the resist;

selectively etching or plating the copper layer using the patterned resist as a mask to thereby form a copper circuit to be used as a part of a circuit board;

measuring a degree of oxidation of said copper layer to thereby determine the presence of less than an excessive degree of said oxidation which is less than about 10 nm on said copper layer, said measuring being accomplished prior to coating the resist on the copper layer by irradiating a surface of the copper layer with an irradiation beam so that at least a portion of the irradiation beam is reflected from the surface as a reflected beam and evaluating a characteristic of said reflected beam as a measure of the degree of oxidation of said copper layer; and after a less than excessive degree of oxidation has been determined, proceeding with said coating of the copper layer with said resist without either removing at least a portion of the oxidized copper or covering the oxidized copper with a copper cladding.

7. A process as set forth in claim 6, wherein said irradiation beam is an ultraviolet or visible light beam having a predetermined wavelength and the characteristic which is evaluated is the intensity of the reflected beam.

8. A process as set forth in claim 7, wherein the evaluation comprises determining the ratio of the intensity of the reflected beam to the intensity of the irradiation beam.

9. A process as set forth in claim 6, wherein said irradiation beam is a visible light beam and the characteristic which is evaluated is the color of the reflected beam.

10. A process as set forth in claim 6, wherein said irradiation beam is an ultraviolet or visible light beam and the characteristic which is evaluated comprises either a ratio of the intensity of a reflected ultraviolet beam to the intensity of an irradiated ultraviolet beam, a hue of a reflected visible light beam, a luminous intensity of a reflected beam, a saturation level of a reflected visible light beam or an intensity of reflection of short wavelength radiation.

11. A process for preparing a circuit board comprising:

coating a resist on a copper layer;

patterning the resist;

selectively etching or plating the copper layer using the patterned resist as a mask to thereby form a copper circuit to be used as a part of a circuit board;

measuring a degree of oxidation of said copper layer to thereby alternatively determine either (1) the presence of an excessive degree of said oxidation equal to or greater than about 10 nm on said copper layer or (2) the presence of less than an excessive degree of said oxidation which is less than about 10 nm on said copper layer, said measuring being accomplished prior to coating the resist on the copper layer by irradiating a surface of the copper layer with an irradiation beam so that at least a portion of the irradiation beam is reflected from the surface as a reflected beam and evaluating a characteristic of said reflected beam as a measure of the degree of oxidation of said copper layer;

if an excessive degree of oxidation is determined, thereafter either removing at least a portion of the oxidized copper or covering the oxidized copper with a copper cladding prior to said coating of the copper layer with said resist; and if a less than excessive degree of oxidation is determined, thereafter proceeding with said coating of the copper layer with said resist without either removing at least a portion of the oxidized copper or covering the oxidized copper with a copper cladding.

12. A process as set forth in claim 11, wherein said irradiation beam is an ultraviolet or visible light beam having a predetermined wavelength and the characteristic which is evaluated is the intensity of the reflected beam.

13. A process as set forth in claim 12, wherein the evaluation comprises determining the ratio of the intensity of the reflected beam to the intensity of the irradiation beam.

14. A process as set forth in claim 11, wherein said irradiation beam is a visible light beam and the characteristic which is evaluated is the color of the reflected beam.

15. A process as set forth in claim 11, wherein said irradiation beam is an ultraviolet or visible light beam and the characteristic which is evaluated comprises either a ratio of the intensity of a reflected ultraviolet beam to the intensity of an irradiated ultraviolet beam, a hue of a reflected visible light beam, a luminous intensity of a reflected beam, a saturation level of a reflected visible light beam or an intensity of reflection of short wavelength radiation.

* * * * *

UNITED STATES PATENT AND TRADEMARK OFFICE
CERTIFICATE OF CORRECTION

PATENT NO. : 5,633,121
DATED : May 27, 1997
INVENTOR(S) : NAMIKI et al.

It is certified that error appears in the above-indentified patent and that said Letters Patent is hereby corrected as shown below:

Col. 1,  line 47, change "interconnection-" to --interconnection.--;
         line 48, change "subtractlye" to --subtractive--.

Col. 3,  lines 63-64, change "con, rising" to --comprising--;
         line 67, change "am ask no" to --a mask to--.

Col. 5,  line 61, change "uv-ray" to --UV-ray--.

Col. 6,  line 22, change "that method" to --that the method--;
         line 27, change "thickhess)" to --thickness)--.

Signed and Sealed this

Second Day of September, 1997

Attest:

BRUCE LEHMAN

Attesting Officer

Commissioner of Patents and Trademarks